(12) United States Patent
Chen et al.

(10) Patent No.: US 8,815,744 B2
(45) Date of Patent: Aug. 26, 2014

(54) TECHNIQUE FOR CONTROLLING TRENCH PROFILE IN SEMICONDUCTOR STRUCTURES

(75) Inventors: Hui Chen, South Jordan, UT (US); Qi Wang, Sandy, UT (US); Briant Harward, West Jordan, UT (US); James Pan, West Jordan, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 202 days.

(21) Appl. No.: 12/109,302

(22) Filed: Apr. 24, 2008

(65) Prior Publication Data

US 2009/0269896 A1   Oct. 29, 2009

(51) Int. Cl.
  *H01L 21/311* (2006.01)
(52) U.S. Cl.
  USPC .................................. 438/702; 257/E21.628
(58) Field of Classification Search
  USPC ......... 438/259, 268–272, 700–702, 712–713; 257/E21.624–E21.629
  See application file for complete search history.

(56) References Cited

U.S. PATENT DOCUMENTS

| | | | | |
|---|---|---|---|---|
| 5,629,237 A * | 5/1997 | Wang et al. | .................... | 438/701 |
| 6,137,135 A | 10/2000 | Kubo et al. | | |
| 6,274,457 B1 * | 8/2001 | Sakai et al. | .................... | 438/424 |
| 6,300,199 B1 | 10/2001 | Reinberg | | |
| 6,495,294 B1 * | 12/2002 | Yamauchi et al. | ............ | 438/597 |
| 2003/0207579 A1 * | 11/2003 | Rattner et al. | ................. | 438/700 |
| 2005/0167742 A1 * | 8/2005 | Challa et al. | ................... | 257/328 |
| 2006/0154438 A1 * | 7/2006 | Kishimoto et al. | ........... | 438/424 |
| 2006/0281249 A1 * | 12/2006 | Yilmaz et al. | ................. | 438/243 |

FOREIGN PATENT DOCUMENTS

| | | |
|---|---|---|
| TW | 344118 | 11/1998 |
| TW | 507328 | 10/2002 |

OTHER PUBLICATIONS

Baliga, pp. 335-349 from *Power Semiconductor Devices*, 1996.
Bailey III, et al., "Scaling of Si and GaAs trench rates with aspect ratio, feature width, and substrate temperature," *J. Vac. Sci. Technol. B*, 13(1):92-104 (1995).
Blauw et al., "Kinetics and crystal orientation dependence in high aspect ratio silicon dry etching," *J. Vac. Sci. Technol. B*, 18(6):3453-3461 (2000).
Chang et al., "Plasma-surface kinetics and feature profile evolution in chlorine etching of polysilicon," *J. Vac. Sci. Technol. A*, 1691):217-224 (1998).
Chen et al., pp. 167-181 from *Lecture Notes on Principles of Plasma Processing*, Kluwer / Academic / Plenum Publishers, New York (2003).
Chin et al., "Structural Effects on a Submicron Trench Process," *J. Electrocem. Soc.*, 132(7):1705-1707 (1985).
Coburn et al., "Conductance consideration in the reactive ion etching of high aspect ratio features," *Appl. Phys. Lett.*, 55(26):2730-2732 (1989).
Coburn et al., "Ion- and electron-assisted gas-surface chemistry—An important effect in plasma etching," *J. Applied Phys.*, 50(5):3189-3196 (1979).

(Continued)

*Primary Examiner* — Calvin Choi

(57) ABSTRACT

A method for forming a semiconductor structure includes the following steps. Trenches are formed in a semiconductor region using a masking layer such that the trenches have a first depth, a first width along their bottom, and sidewalls having a first slope. The masking layer is removed, and a bevel etch is performed to taper the sidewalls of the trenches so that the sidewalls have a second slope less than the first slope.

30 Claims, 6 Drawing Sheets

(56) References Cited

OTHER PUBLICATIONS

Gottscho et al., "Microscopic uniformity in plasma etching," *J. Vac. Sci. Technol. B*, 10(5):2133-2147 (1992).

Gray et al., "Phenomenological modeling of ion-enhanced surface kinetics in fluorine-based plasma etching," *J. Vac.Sci. Technol. B*, 11(4):1243-1257 (1993).

Kojima et al., "Model for dry etching of silicon," *J. Appl. Phys.* 70(6):29012904 (1991).

Lafferty et al. eds., "Flow of Gases Through Tubes and Orifices," pp. 81-105 from *Foundations of Vacuum Science and Technology*, Wiley, New York (1998).

Lieberman et al., Chapter 15, Etching, pp. 472-511 from *Principles of Plasma Discharges and Materials Processing*, published in 1994 by John Wiley & Sons, Inc.

O'Hanlon, J.F., pp. 32-49 from *A User's Guide to Vacuum Technology, 3rd Edition*, Wiley, Hoboken, New Jersey (2003).

Prabhakaran et al., "Fabrication of Thin-Flm V-Groove Inductors Using Composite Magnetic Materials," *IIWIPP Proceedings, IEEE International Workshop on Integrated Power*Packaging, pp. 102-105 (2000).

Shaqfeh et al., "Simulation of reactive ion etching pattern transfer," *J.Appl. Phys.*, 66(10):4664-4675 (1989).

Ulacia et al. "Crystal-Orientation Depedent Etch Rates and a Trench Model for Dry Etching," *J. Electrochem. Soc.*, 135(6):1521-1525 (1988).

Winters et al., "Plasma-assisted etching mechanisms: The implications of reaction probability and halogen coverage,"*J. Vac. Sci. Technol. B*, 3(5):1376-1383 (1985).

Office Action received for Chinese Patent Application No. 200910137224.6, mailed on Mar. 22, 2012, 20 pages of English translation.

\* cited by examiner

TECHNIQUE FOR CONTROLLING TRENCH PROFILE IN SEMICONDUCTOR STRUCTURES

BACKGROUND OF THE INVENTION

The present invention relates in general to semiconductor technology, and more particularly to techniques for controlling the trench profile in semiconductor structures.

In many semiconductor structures, trenches of varying depths and widths that subsequently are partially or completely filled with various materials need to be formed. For example, in power device technology, trenches are formed for various purposes. In trench-gate power MOSFETs, trenches housing the gate electrode are formed; in shielded gate power MOSFETs, deeper trenches housing both a shield electrode and a gate electrode are formed; in yet other types of power devices which include what is commonly referred to as charge balance alternating p-n pillars structure, even deeper trenches are formed and subsequently filled with silicon material to form the alternating p-n pillars. In order to form the trenches in these structures, various silicon etch processes such as a dry etch process are used. However, as the critical dimensions (CD) continue to shrink, the width of the trenches is reduced while the depth of the trenches is not changed, or in some cases is increased. An aspect ratio of depth/width of the trenches is thus increased. The increasing aspect ratio of the trenches may adversely affect the filling of the trenches with such materials as gate polysilicon, epi material or dielectric material. Some common problems are formation of gaps, voids and/or defects in the filling material, which can adversely impact the device performance characteristics. Methods such as wet etch processes have been proposed to obtain trenches with wider upper portions, however, the wet etch process is an isotropic process and difficult to control.

Accordingly, there is a need for techniques which provide precise control over the trench profile, particularly for mid to high aspect ratio trenches.

BRIEF SUMMARY OF THE INVENTION

In accordance with an embodiment of the invention, a method for forming a semiconductor structure includes the following steps. Trenches are formed in a semiconductor region using a masking layer such that the trenches have a first depth, a first width along their bottom, and sidewalls having a first slope. The masking layer is removed, and a bevel etch is performed to taper the sidewalls of the trenches so that the sidewalls have a second slope less than the first slope.

In one embodiment, after the bevel etch, a width of the trenches gradually decreases from the top toward the bottom of the trenches.

In another embodiment, the bevel etch removes a layer of the semiconductor region along a top surface of the semiconductor region between adjacent trenches.

In another embodiment, the step of forming trenches is carried out using plasma dry etch.

In another embodiment, the bevel etch is carried out using at least one fluorine-containing gas and at least one inert gas.

In another embodiment, the at least one fluorine-containing gas comprises one or both of SF6 and NF3, and the at least one inert gas comprises one or more of N2, He, Ar, and Xe.

In another embodiment, the second slope is dependent on a conduction loss value L and a surface reaction loss value S.

In another embodiment, the second slope substantially correlates with a trench profile angle θ that is provided by:

$$\tan\theta = \frac{z}{t \cdot C \cdot S \cdot [\Phi(0) - \Phi(z)]} = \frac{1}{t \cdot C \cdot \Phi(0)} \cdot \frac{1}{S(L+S)},$$

wherein t represents etch time, C is etch rate constant, and Φ(0) represents flux of etchant species at trench depth "0."

In another embodiment, the bevel etch does not widen the first width along the bottom of the trenches.

In another embodiment, the bevel etch does not extend the trenches deeper than the first depth.

In another embodiment, a gate electrode a thick bottom dielectric underneath it is disposed in each trench. In yet another embodiment a shield electrode and a gate electrode are disposed in each trench. In still another embodiment, the trenches are filled with silicon material having a conductivity type opposite that of the semiconductor region so that the silicon material and the semiconductor region form alternating p-n pillars.

The following detailed description and the accompanying drawings provide a better understanding of the nature and advantages of the present invention.

DETAILED DESCRIPTION OF THE INVENTION

According to embodiments of the present invention, techniques directed to semiconductor structures with trenches and their processing are provided. In one embodiment, a method for forming a semiconductor structure with trenches having sloped sidewalls provides precise control over the profile of the trenches for low, medium or high aspect ratio trenches. The precise control for any given trench aspect ratio enables forming trenches with profiles that are best suited for subsequent processings, such as filling the trenches with gate electrode material (as in trench gate FETs), or filling the trenches with silicon epitaxial material (as in alternating p-n pillar structures in charge balance devices), or filling the trenches with dielectric material (e.g., to form the thick bottom dielectric (TBD, or to form the inter-electrode dielectric (IED) in shielded gate FETs).

The ability to form the desired trench profile for any aspect ratio ensures that the material subsequently formed in the trenches have the desired characteristics and are void-free.

Further, the techniques in accordance with the invention allow maintaining a particular width (or CD) along the trench bottom, as opposed to V-shaped trenches with sharp bottom polysilicon gates which can cause Igssr leakage in MOSFETs. The techniques in accordance with the invention can be used in any semiconductor structure with trenches where control over the trench profile would be beneficial. In the description that follows, a number of power devices are used to describe possible applications of the invention, however, the techniques in accordance with the invention can be used in other technology areas. For example, control of the trench profile as described herein may advantageously be used to provide channel length control in trench CMOS transistors, or in forming V-groove inductors in power converters, or in fabrication of MEMS devices.

Figure 1A:
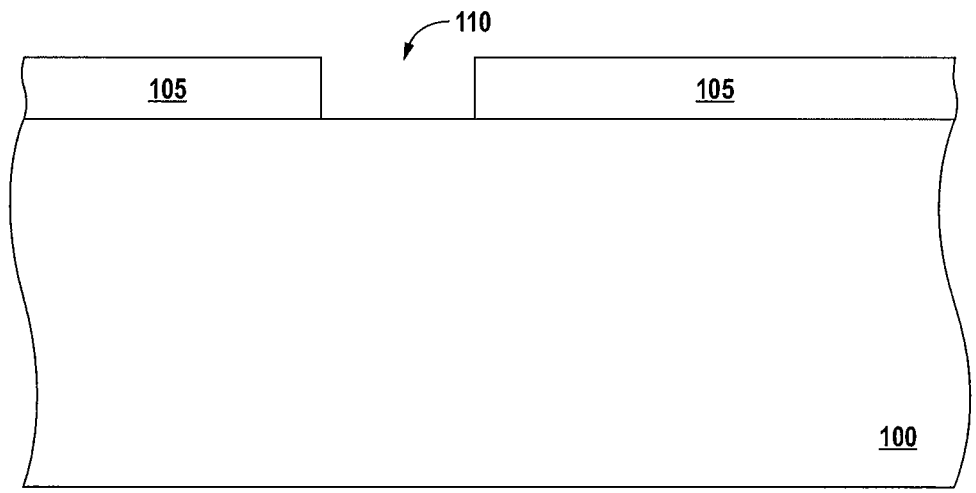
FIGS. 1A-1D are cross-sectional views showing an exemplary method for forming trenches in accordance with an embodiment of the present invention.

FIGS. 1A-1D are cross-sectional views showing a method for forming trenches in accordance with an embodiment of the present invention. In FIG. 1A, mask layer 105 having opening 110 is formed over semiconductor region 100 using known techniques. Semiconductor region 100 can comprise silicon material, III-V compound material, silicon/germanium (SiGe), epitaxial silicon, silicon-on-insulator (SOI), display substrate such as a liquid crystal display (LCD), a plasma display, an electro luminescence (EL) lamp display, or a light emitting diode (LED) substrate. Semiconductor 100 can include at least one doped layer such as a heavily doped silicon layer (not shown). The heavily doped silicon layer may be formed by an implantation process. In one embodiment for forming an n-channel transistor, the heavily doped silicon layer may include n-type dopants such as phosphorus, arsenic and/or other group V elements.

Figure 1B:
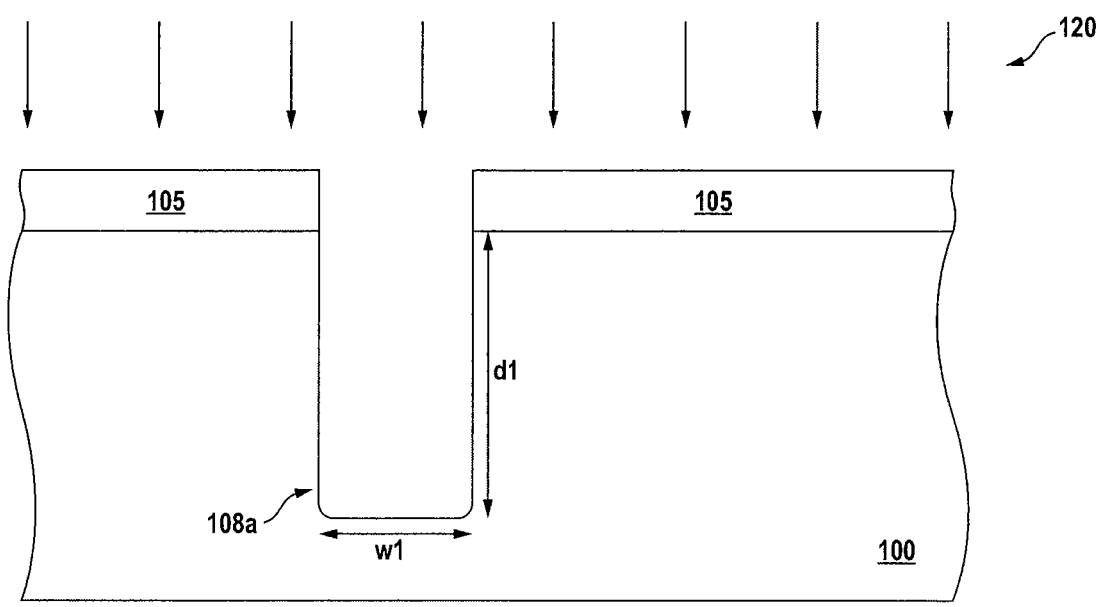

Mask layer 105 can be a photoresist mask and/or a dielectric mask such as a nitride mask, oxynitride mask, or an oxide-nitride-oxide (ONO) mask. Opening 110 in mask layer 105 can be defined by a photolithography process. In FIG. 1B, etch process 120 can remove a portion of semiconductor region 100 by using mask layer 105 as an etch mask to form trench 108a within semiconductor region 100. Etch process 120 can be a plasma dry etch process using various known precursors for etching semiconductor region 100. While trench 108a is shown as having vertical sidewalls, the sidewalls of the trench may in practice be slightly tapered. Trench 108a has a bottom width "w1" and depth "d1."

Figure 1C:
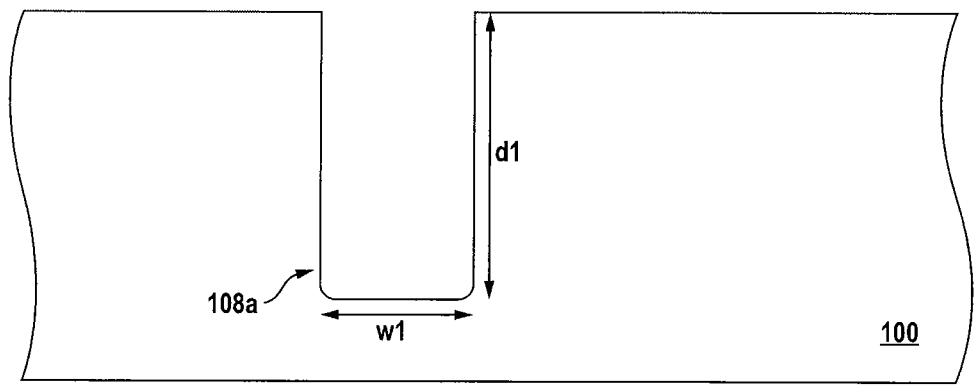
Figure 1D:
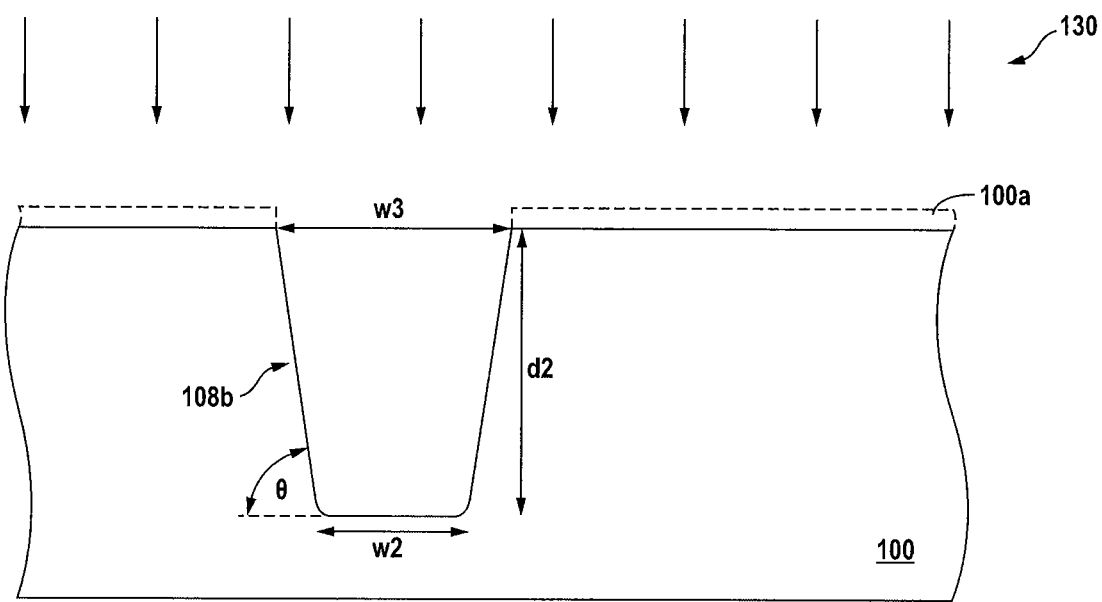

In FIG. 1C, mask layer 105 is removed using known techniques. The Mask removing process can include a dry etch process and/or a wet etch process depending on the mask material. The dry etch process can use various etch gases to remove a photoresist mask layer and/or a dielectric mask layer. In FIG. 1D, bevel etch process 130 is carried out to obtain the desired trench profile, including the desired profile angle θ, trench depth d2, and trench bottom width w2. Because bevel etch 130 is carried out without a mask covering the mesa regions adjacent trench 108b, a top layer 100a of semiconductor region 100 is removed during the bevel etch process. The width of trench 108b at the top of the trench is marked in FIG. 1D as w3.

In one embodiment, for low (e.g., less than 5:1) to medium (e.g., 5:1 to 8:1) aspect ratio trenches, bevel etch 130 may extend the trench deeper and widen the bottom of the trench more than those obtained in the initial trench etch 120 (i.e., d2>d1 and w2>w1), while for higher aspect ratio trenches (e.g., greater than 8:1), bevel etch 130 may not extend the trench deeper and may maintain the same trench bottom width or CD (i.e., d2=d1 and w2=w1). For the higher aspect ratio trenches, depending on the target final trench depth, a deeper trench may be etched during the initial etch process 120 (FIG. 1B) to compensate for the depth loss due to removal of top layer 100a of semiconductor region 100.

Bevel etch process 130 may include at least one fluorine-containing gas (e.g., $SF_6$ and/or $NF_3$) as the main or reactant gas, and at least one inert or additive gas, e.g., $N_2$, He, Ar, Xe and/or other inert gas. In general, the fluorine-containing etch gas such as $SF_6$ can have a flow rate between about 6 standard cubic centimeter per minute (sccm) and about 100 sccm; the additive gas can have a flow rate between about 20 sccm and about 400 sccm; a power of bevel etch process 130 can be between about 50 Watts and about 1,000 Watts; a process temperature can be between about 0° C. and about 80° C.; and a process pressure can be between about 5 milliTorrs (mTorrs) and about 80 mTorrs. In one specific embodiment where trenches with a depth in the ranged of about 0.5 μm to 50.0 μm, a bottom width in the range of about 0.1 μm to 5.0 μm, and a profile angle 0 in the range of about 45° to 85° are desired, the following ranges of values are used in bevel etch 130: $SF_6$ flow rate in the range of about 20 to 40 sccm; additive gas flow rate in the range of about 90 to 120 sccm; bias power in the range of 300 to 500 Watts; process temperature in the range of about 40 to 60° C.; and process pressure in the range of about 5 mTorrs to 40 mTorrs.

Bevel etch process 130 bevels the angle of the slightly tapered sidewalls of trench 108a (FIG. 1C) to thereby obtain the desired sidewall slope as show in FIG. 1D. In one embodiment, the desired profile angle θ can be obtained by balancing the chemical etch and the physical sputtering. Two parameters are used in accurately predicting the profile angle θ for different aspect ratio trenches and different etch process conditions. The first parameter is conductance loss "L" which reflects the percentage loss per travel distance due to conductivity restriction. The second parameter is surface reaction loss "S" which reflects the percentage loss per travel distance due to surface reaction. Conductance loss L has a unit of 1/length (e.g., 1/μm). Further, conductance loss L is substantially proportional to 1-K, wherein K is the well known transmission probability. Conductance loss L varies between 0 and 1, with 0 reflecting zero percent conduction loss, and 1 reflecting 100% conduction loss. Therefore, higher L values reflect greater restriction of reactant transport into the trench resulting in a higher bevel effect. Surface reaction loss S also has a unit of 1/length and is substantially proportional to the well known surface reaction probability. Surface reaction loss S varies between 0 and 1, with 0 reflecting zero percent reaction loss, and 1 reflecting 100% reaction loss. Therefore, higher S values reflect greater sidewall taper.

In the equations that follow, flux of etchant species at depth z along the trench depth is represented as $\Phi(z)$. Thus, the flux at top of the trench (i.e., at depth 0) is represented by $\Phi(0)$. The change in flux $d\Phi$ across a change $dz$ along the trench depth is provided as:

$$d\Phi = -(L+S)\cdot\Phi\cdot dz \quad (1)$$

By integrating the depth from 0 to z, formula (1) is deduced to formula (2) below:

$$\Phi(z) = \Phi(0)\exp(-z/\lambda) \quad (2)$$

wherein, λ reflects the diffusion length and is equal to $1/(L+S)$.

Based on formula (2), profile angle θ is related to conductance loss L and surface reaction loss S as shown in formula (3) below:

$$\tan\theta = \frac{z}{t \cdot C \cdot S \cdot [\Phi(0) - \Phi(z)]} = \frac{1}{t \cdot C \cdot \Phi(0)} \cdot \frac{1}{S(L+S)} \quad (3)$$

wherein, t is etch time and C is etch rate constant.

Using formula (3), the profile angle θ can be precisely predicted for a given aspect ratio. As can be seen from FIGS. 1C and 1D, the bevel etch designed based on formula (3) widens the top opening w3 of the trench and increases the taper of the trench sidewalls (i.e., reduces the slope of the trench sidewalls so that the sidewalls are less vertical). The etch chemistry, etch temperature, and etch bias power affect the surface reaction loss S. It has been found that because $SF_6$ based etch chemistry has much higher surface reaction probability on silicon than $CF_4$, the surface reaction loss for $SF_6$ is much higher than $CF_4$, and thus $SF_6$ impacts the profile angle θ to a greater extent than does $CF_4$. On the other hand, conductance loss L is determined primarily by the physical aspect ratio of the trench. It has been found that higher aspect ratios impact the profile angle θ more than smaller aspect ratios. The trench profile thus can be tailored to the subsequent process. For example, if the trenches are to be filled with a particular material (such as polysilicon, silicon epi or insulator), the trench profile can be designed to ensure that filling the trench is carried out easily and in a void-free manner, even for high aspect ratio trenches.

Figure 2A:
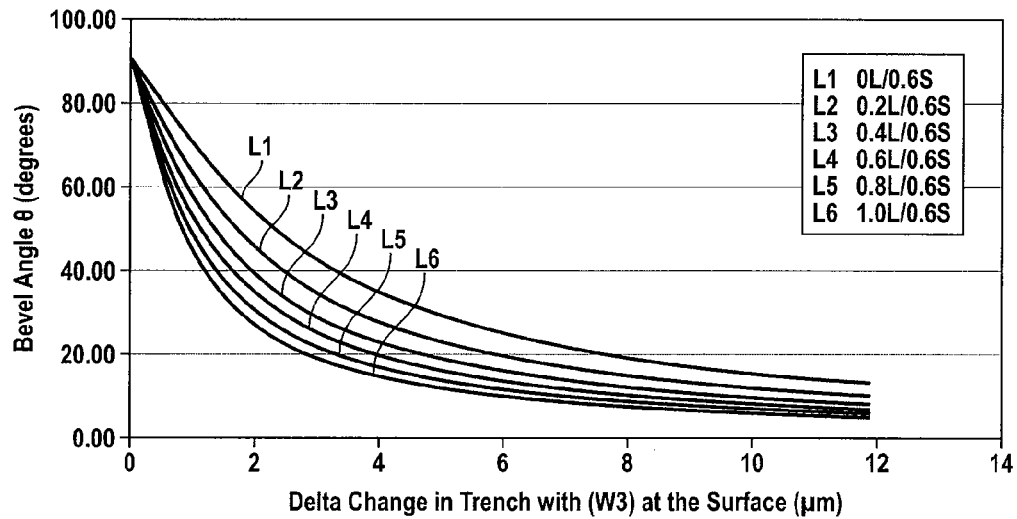
FIGS. 2A and 2B are diagrams showing the relationship between trench profile angle and the delta change in the trench width at the silicon surface for various combinations of values of conductance loss L and surface reaction loss S.
Figure 2B:
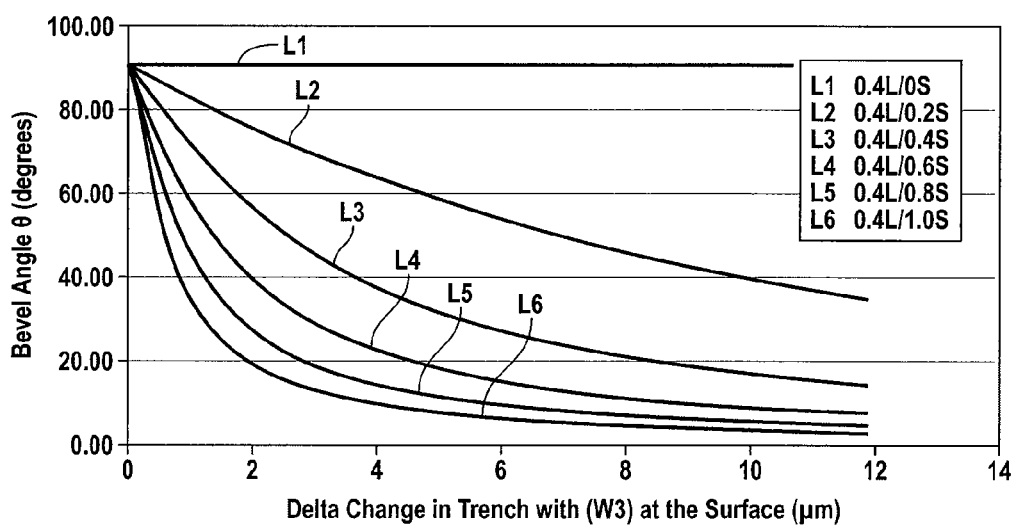

FIGS. 2A and 2B are diagrams showing the relationship between profile angle and delta change in trench width (w3) at the top of the trench for various combinations of values of conductance loss L and surface reaction loss according to formula (3). In FIG. 2A, surface reaction loss S is fixed to 0.6 and conductance loss L is varied from 0 to 1 in increments of 0.2. As can be seen, with increasing conduction loss L (i.e., with increasing restriction due to conduction), the profile angle θ reduces (i.e., the greater the trench sidewall taper).

In FIG. 2B, conductance loss L is fixed to 0.4 and surface reaction loss S is varied from 0 to 1 in 0.2 increments. As can be seen, with increasing surface reaction loss (i.e., with increasing surface reaction probability), profile angle θ reduces. Profile angle θ is substantially maintained at about 90° for surface reaction loss of 0. A comparison of FIGS. 2A and 2B reveals that surface reaction loss S has a greater impact on profile angle θ than conductance loss L.

Figure 3A:
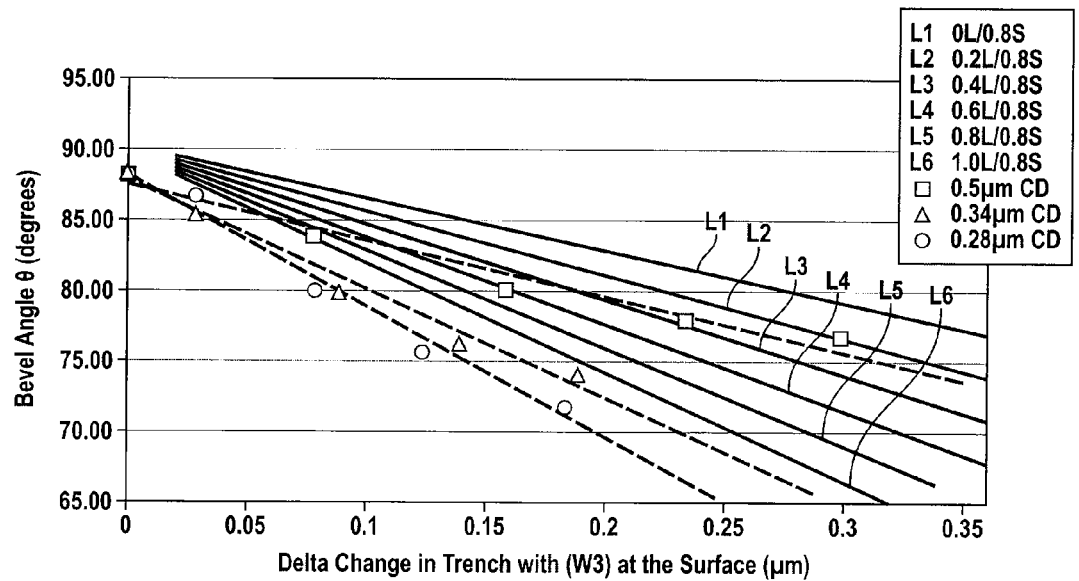
FIGS. 3A and 3B are diagrams comparing the trend lines for simulated model versus experimental silicon for various combinations of values of conductance loss L and surface reaction loss S.
Figure 3B:
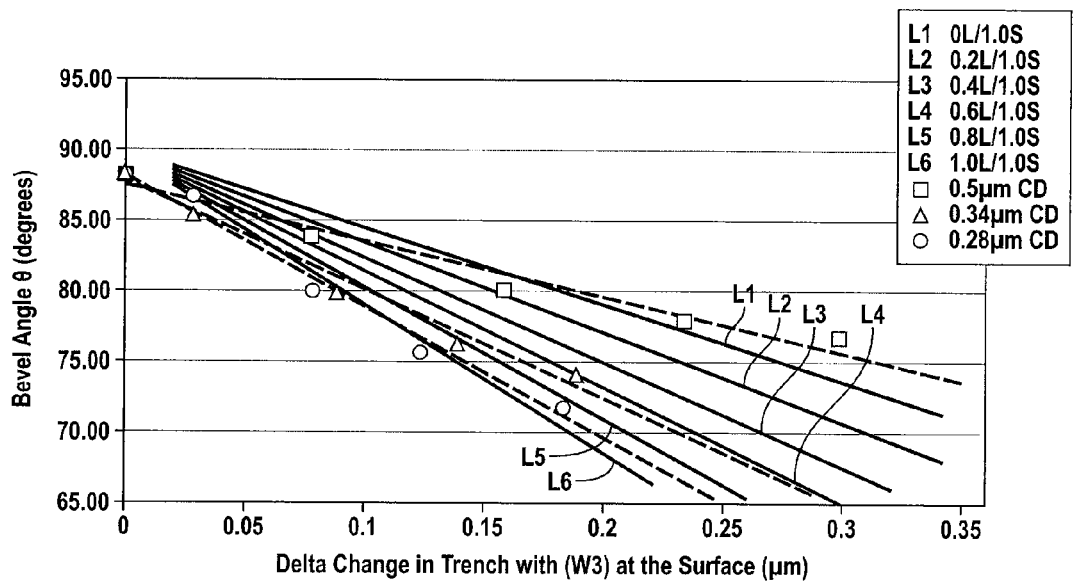

FIGS. 3A and 3B are diagrams comparing the trend lines for simulated model versus experimental silicon. In both diagrams, solid lines represent simulated model data and dashed lines represent experimental silicon data for various trench CDs and a trench depth of about 2 μm. The trend lines for the experimental silicon were found to match well with the simulated model, particularly for S values in the higher ranges, for example, 0.8 to 1.

Figure 4:
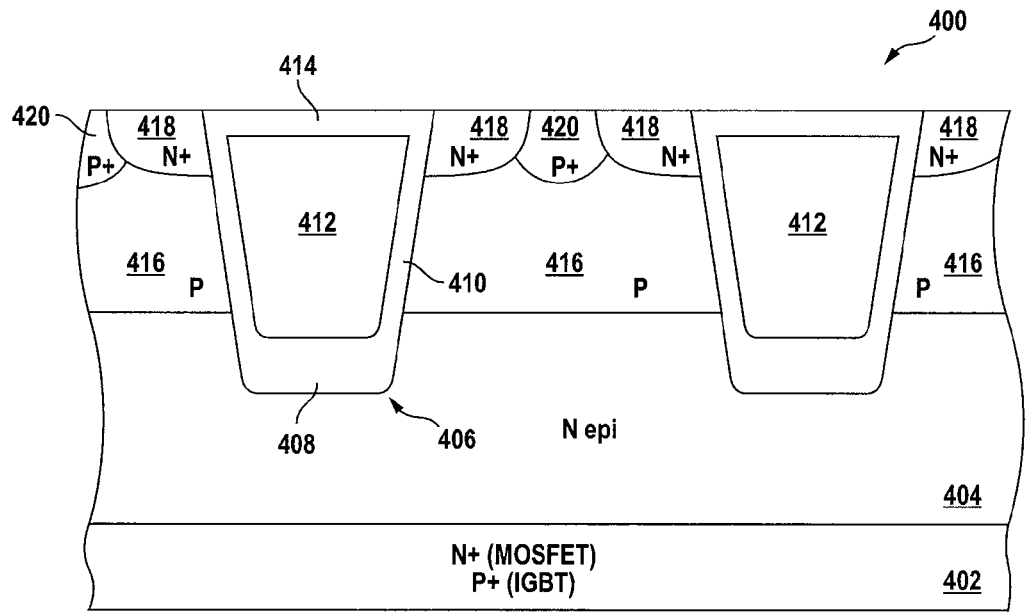
FIG. 4 shows a trench gate FET where the trenches are formed in accordance with an embodiment of the present invention.
Figure 5:
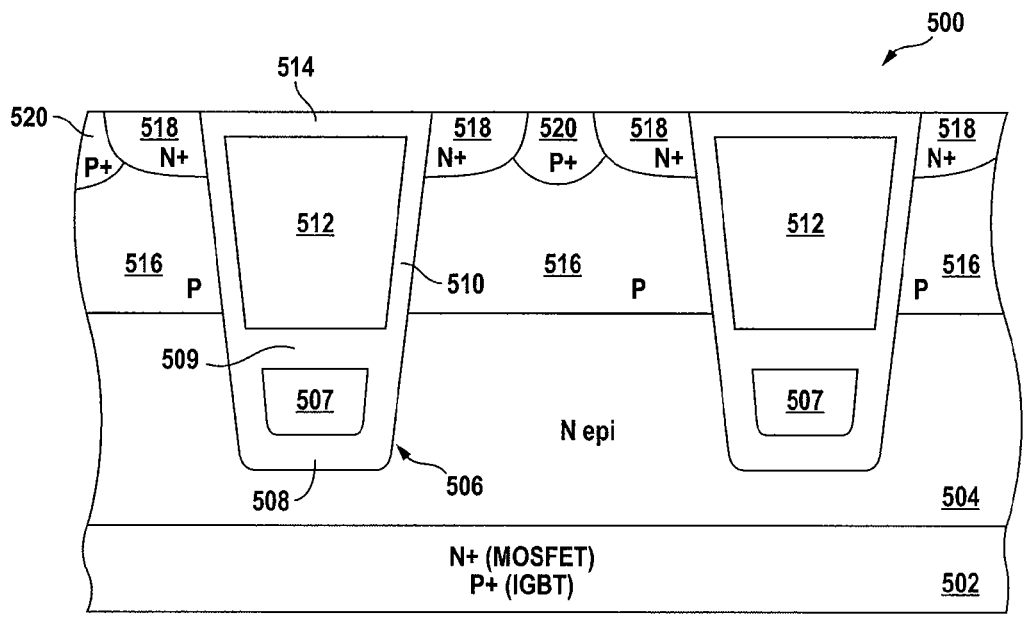
FIG. 5 shows a shielded gate trench FET where the trenches are formed in accordance with an embodiment of the present invention.

The above techniques for forming trenches can be used in any semiconductor device or technology where precise control of trench profile is desirable. FIGS. 4 and 5 are two exemplary trench transistors where the techniques in accordance with the invention may be advantageously used.

FIG. 4 is a cross section view of a trench gate FET 400 where trenches 406 are formed in accordance with one embodiment of the present invention. Lightly doped epitaxial layer 404 is formed over highly doped substrate 402 using known techniques. Trenches 406 extending into and terminating within epitaxial layer 404 are advantageously formed using the above-described techniques in accordance with the invention. That is, a first conventional silicon etch is carried out using a masking layer, and then the masking layer is removed followed by a bevel etch designed using formula (3) in order to obtain the desired trench profile angle. In designing the trench etch, the removal of a top layer of epitaxial layer 404 during the bevel etch can be taken into account. In an alternate embodiment, trenches 406 are etched to extend deeper terminating closer to or within substrate 402. Adjusting the bevel etch parameters to obtain the desired trench profile for such deeper trenches would be carried out in accordance with the above described techniques.

Thick bottom dielectric (TBD) 408 (e.g., comprising oxide) is optionally formed along the bottom of each trench 406 using known techniques. TBD 408 helps reduce the gate to drain capacitance. One technique for forming TBD 408 includes filling trenches 406 with dielectric material followed by recessing the dielectric material in the trench to the desired depth. The ability to form trenches 406 with the desired profile insures that the step of filling trenches 406 with dielectric material is carried out easily and in a void-free manner.

Next, gate dielectric 410 (e.g., comprising gate oxide) lining the trench sidewalls is formed using known techniques. Where TBD 408 is not formed, gate dielectric 410 extends along the bottom of each trench 406 as well. Recessed gate electrode 412 (e.g., comprising doped or undoped polysilicon) is formed in each trench 406 using conventional techniques. Again, the trench profile can be tailored using the above described techniques in order to insure that gate electrode 412 is formed in a void-free manner. Dielectric cap 414 (e.g., comprising oxide and/or BPSG) is formed over gate electrodes 412 using conventional methods. While dielectric cap 414 is shown to be fully contained within trenches 406, in an alternate embodiment, the dielectric cap is formed so as to extend out of the trenches and overlap adjacent source regions 418.

Body region 416 extending part way into epitaxial layer 404 is formed using conventional techniques. Highly doped source regions 418 are formed in body regions 416 adjacent trenches 406 using known source implant techniques. Highly doped heavy body regions 420 are formed in body region 416 between adjacent source regions 418 using known processes. Top-side and bottom-side interconnect layers (not shown), e.g., comprising a metal, are respectively formed on the topside and bottoms-side of FET 400 using conventional methods. The top-side interconnect layer electrically contacts source regions 418 and heavy body regions 420, and the bottom-side interconnect layer electrically contacts substrate 402. The process steps for forming FET 400 may be carried out in a different order than those described above.

Where substrate 402 is of n+ conductivity type, FET 400 forms an n-channel MOSFET. A p-channel MOSFET 400 would be formed by reversing the conductivity type of the various regions of the n-channel MOSFET. Where substrate 402 is of p+ conductivity type, FET 400 forms an n-channel IGBT. A p-channel IGBT would be formed by reversing the conductivity type of the various regions of the n-channel IGBT.

FIG. 5 shows a shielded gate trench FET 500 where trenches 506 are formed in accordance with an embodiment of the present invention. Lightly doped epitaxial layer 504 is formed over highly doped substrate 502 using known techniques. Deep trenches 506 extending into and terminating within epitaxial layer 504 are advantageously formed using the above-described techniques in accordance with the invention. That is, a first conventional silicon etch is carried out using a masking layer, and then the masking layer is removed followed by a bevel etch designed using formula (3) in order to obtain the desired trench profile angle. Again, in designing the trench etch, the removal of a top layer of epitaxial layer 504 during the bevel etch can be taken into account. In an alternate embodiment, trenches 506 are etched to extend even deeper terminating within substrate 502. Adjusting the bevel etch parameters to obtain the desired trench profile for such deep trenches would be carried out in accordance with the above described techniques.

Shield dielectric 508 (e.g., comprising oxide, or oxynitride) is formed along lower trench sidewalls and trench bottom using known techniques. Shield electrode 507 (e.g., comprising doped or undoped polysilicon) filling a lower portion of each trench 506 is formed using conventional techniques. The trench profile can be tailored using the above described techniques in order to insure that shield electrode 507 has the desired characteristics.

An inter-electrode dielectric (IED) 509 (e.g., comprising oxide) is formed over shield electrode 507 using known process techniques. In one embodiment, forming IED 509 includes filling trenches 506 with dielectric material followed by recessing the dielectric material in the trenches so as to obtain an IED with the desired thickness. The ability to form trenches 506 with the desired profile insures that the steps of filling trenches 506 with dielectric material and then recessing the dielectric material result in formation of an IED with the desired characteristics.

Next, gate dielectric 510 (e.g., comprising gate oxide) lining the upper trench sidewalls is formed using known techniques. In one embodiment wherein a thick IED is not necessary, no separate process steps are carried out for forming IED 509, and instead the gate dielectric 510 is extended over shield electrodes 507 during the step of forming gate dielectric 510.

Recessed gate electrodes 512 (e.g., comprising doped or undoped polysilicon) are then formed in each trench 506 over IED 509 using conventional techniques. The remaining structural features of FET 500 including dielectric cap 514, body region 516, source regions 518, heavy body regions 520, and top-side and bottom-side interconnect layers (not shown) may be formed in a similar manner to those described above in reference to FIG. 4 and thus will not be described. Also, the conductivity type of the various regions where FET 500 is an n-channel or p-channel MOSFET, or is an n-channel or p-channel IGBT would similar to those described above in reference to FET 400 in FIG. 4.

Figure 6:
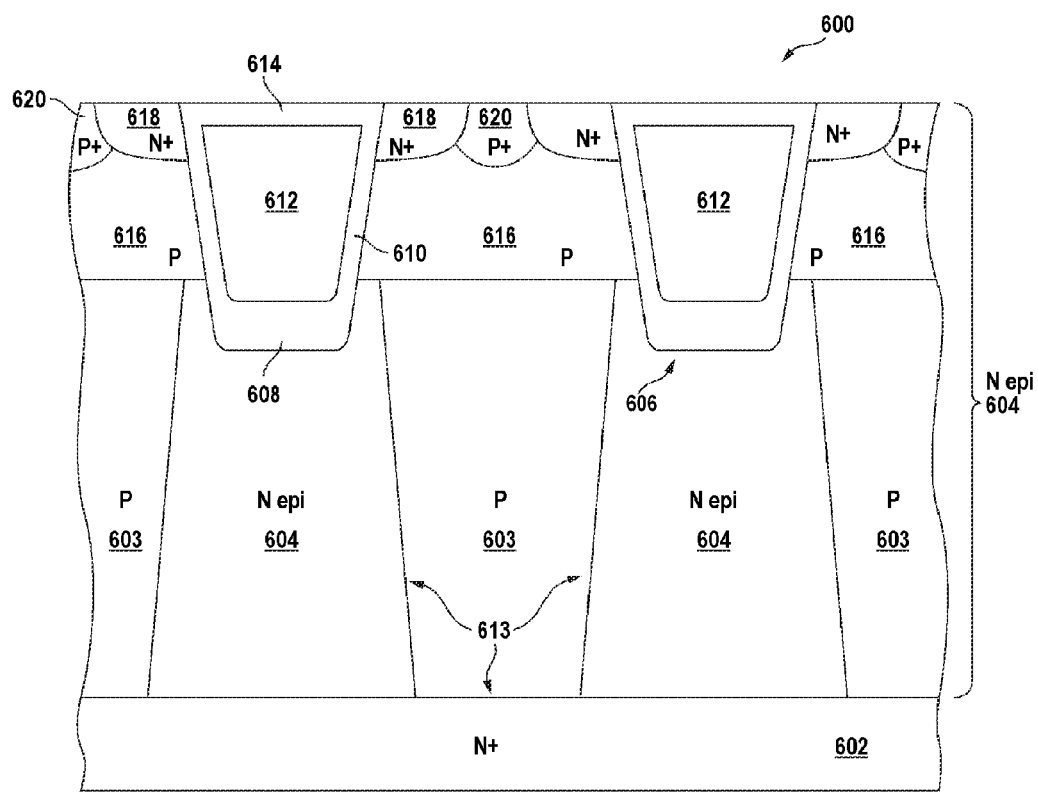
FIG. 6 shows a charge balance trench gate FET where the alternating p-n pillars are formed using trench techniques in accordance with an embodiment of the present invention.

FIG. 6 is a cross section view of yet another power transistor in which the above-described techniques may be advantageously used to form trenches of the desired profile. FET 600 in FIG. 6 includes a charge balance alternating p-n pillar structure, the advantages and features of which are well documented. However, conventional techniques for forming the p-n pillars such that the desired charge balance is obtained require rather complex process sequences. One such technique involves forming deep trenches in an n-epi and filling the trenches with p-type silicon material. Properly filling such deep trenches with silicon material has presented challenges including filling the trenches in a void-free manner.

In FIG. 6, gate trenches 606 and the gate structure therein (including gate electrode 612 TBD 608 and gate dielectric 610), body region 616, source regions 618, heavy body regions 620 and dielectric cap 614 all have a similar structure to those in FET 400 (FIG. 4) and thus the process for forming this portion of FET 600 will not be described. However, prior to forming this portion of FET 600, the alternating p-n pillars need to be formed.

After forming n-epi 604 over substrate 602, deep trenches 613 are formed in n-epi 604 using the techniques in accordance with the invention. That is, a first conventional silicon etch is carried out using a masking layer, and then the masking layer is removed followed by a bevel etch designed using formula (3) in order to obtain the desired trench profile angle. Again, in designing the trench etch, the removal of a top layer of epitaxial layer 604 during the bevel etch can be taken into account. While trenches 613 are shown to extend clear through epitaxial layer 604 reaching substrate 602, in an alternate embodiment, the trench etch is designed so that trenches 613 terminate just prior to reaching substrate 602. A bottom strip of epitaxial layer 604 thus remains over substrate 602 which can serve as a buffer layer.

Trenches 613 are then filled with epitaxial silicon material 603 using known techniques. The bevel etch can be carefully designed per formula (3) above to ensure that trenches 613 have the appropriate profile so that trenches 613 are properly filled and the desired charge balance characteristic is obtained. Further, while trenches 613 appear to be wide, in some devices, trenches 613 can be quite narrow and deep (i.e., have a high aspect ratio). Filling such trenches with silicon material can be a very difficult task. However, the techniques according to the present invention can be used to carefully design the trench etch so that trenches with profiles that are suitable for the subsequent step of filling the trenches with epitaxial silicon are formed.

Note that the above-described process steps for forming the p-n pillars can be used in manufacturing any power device where such charge balance structure can advantageously be used. For example, instead of the trench gate FET shown in FIG. 6, shielded gate FETs (such as that shown in FIG. 5) or planar gate FETs where the gate electrode extends laterally over the silicon rather than in a trench can be integrated with the above-described process for forming charge balance p-n pillars.

Where a range of values is provided, it is understood that each intervening value (to the tenth of the unit of the lower limit unless the context clearly dictates otherwise) between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a method" includes a plurality of such methods and reference to "the precursor" includes reference to one or more precursors and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

Although a number of specific embodiments are shown and described above, embodiments of the invention are not limited thereto. Therefore, the scope of the present invention should be determined not with reference to the above description but should, instead, be determined with reference to the appended claims, along with their full scope of equivalents.

What is claimed is:

1. A method for forming a semiconductor structure, comprising:
   forming a single masking layer on a semiconductor region;
   forming a trench in the semiconductor region using an opening in the single masking layer, the trench having a sidewall having a first slope and defining a mesa region adjacent to the trench;
   removing completely the single masking layer; and
   performing a bevel etch to taper the sidewall of the trench so that the sidewall has a second slope that is less than the first slope.

2. The method of claim 1, wherein after the bevel etch, a width of the trench gradually decreases from a top of the trench toward a bottom of the trench.

3. The method of claim 1, wherein the trench is a first trench, the method further comprising:
   forming a second trench, the mesa region being disposed between the first trench and the second trench, the bevel etch removing a layer of the semiconductor region along a top surface of the mesa region.

4. The method of claim 1, wherein the forming the trench is performed using a plasma dry etch.

5. The method of claim 1, wherein the bevel etch is performed using at least one fluorine-containing gas and at least one inert gas.

6. The method of claim 5, wherein the at least one fluorine-containing gas includes one or both of $SF_6$ and $NF_3$, and the at least one inert gas includes one or more of $N_2$, He, Ar, and Xe.

7. The method of claim 1, wherein the second slope is dependent on a conduction loss value L and a surface reaction loss value S.

8. The method of claim 1, wherein an angle of the second slope of the trench θ is provided by:

$$\tan\theta = \frac{1}{t \cdot C \cdot \Phi(0)} \cdot \frac{1}{S(L+S)},$$

wherein t represents etch time, C is an etch rate constant, and Φ(0) represents flux of an etchant species at a trench depth "0".

9. The method of claim 8, wherein a conduction loss value L is proportional to 1-K, wherein K is transmission probability, and a surface reaction loss value S is proportional to surface reaction probability.

10. The method of claim 1, wherein the bevel etch does not widen a width along a bottom of the trench.

11. The method of claim 1, wherein the bevel etch does not extend a depth of the trench.

12. The method of claim 1, further comprising:
   forming a gate dielectric lining the sidewall of the trench;
   forming a gate electrode in the trench;
   forming a well region in the semiconductor region; and
   forming a source region in the well region adjacent the trench, the source region having a conductivity type opposite a conductivity type of the well region.

13. The method of claim 1, further comprising:
   forming a shield dielectric lining a lower portion of the sidewall and a bottom surface of the trench;
   forming a shield electrode in a lower portion of the trench, the shield electrode being insulated from the semiconductor region by the shield dielectric;
   forming an inter-electrode dielectric over the shield electrode;
   forming a gate electrode in the trench over the inter-electrode dielectric;
   forming a well region in the semiconductor region; and
   forming a source region in the well region adjacent the trench, the source region having a conductivity type opposite a conductivity type of the well region.

14. The method of claim 1, further comprising:
   disposing, within the trench, a silicon material having a conductivity type opposite a conductivity type of the semiconductor region so that the silicon material and the semiconductor region collectively form at least a portion of a p-n pillar.

15. The method of claim 1, wherein the semiconductor region includes an epitaxial layer extending over a substrate, and the trench is formed in the epitaxial layer, the method further comprising:
   disposing within the trench a silicon material having a conductivity type opposite a conductivity type of the epitaxial layer such that the silicon material and the epitaxial layer form at least a portion of a p-n pillar.

16. A method for forming a semiconductor structure, comprising:
   forming a single masking layer over a semiconductor region;
   forming an opening in the single masking layer;
   performing a first etch to form a trench in the semiconductor region through the opening in the masking layer, the trench having a sidewall having a first slope, the trench defining a mesa region adjacent the trench;
   removing completely the single masking layer; and
   performing a second etch to taper the sidewall of the trench such that the sidewall of the trench has a second slope that is less than the first slope, and such that the trench has a width that gradually decreases from a top portion of the trench toward a bottom portion of the trench.

17. The method of claim 16, wherein the trench is a first trench, the method further comprising:
   forming a second trench, the mesa region being disposed between the first trench and the second trench, the second etch removing a layer of the semiconductor region along a top surface of the mesa region.

18. The method of claim 16, wherein forming the trench is performed using a plasma dry etch.

19. The method of claim 16, wherein the second etch is performed using at least one fluorine-containing gas and at least one inert gas.

20. The method of claim 16, wherein an angle θ of a profile of the trench is provided by:

$$\tan\theta = \frac{1}{t \cdot C \cdot \Phi(0)} \cdot \frac{1}{S(L+S)},$$

wherein t represents etch time, C is an etch rate constant, and Φ(0) represents flux of an etchant species at a trench depth "0".

21. The method of claim 16, further comprising:
   forming a gate dielectric lining the sidewall of the trench;
   forming a gate electrode in the trench;
   forming a well region in the semiconductor region; and
   forming a source region in the well region adjacent the trench, the source region having a conductivity type opposite a conductivity type of the well region.

22. The method of claim 16, further comprising:
   forming a shield dielectric lining a lower portion of the sidewall and a bottom surface of the trench;

forming a shield electrode in a lower portion of the trench, the shield electrode being insulated from the semiconductor region by the shield dielectric;

forming an inter-electrode dielectric over the shield electrode;

forming a gate electrode in the trench over the inter-electrode dielectric;

forming a well region in the semiconductor region; and forming a source region in the well region adjacent the trench, the source region having a conductivity type opposite a conductivity type of the well region.

23. The method of claim 16, further comprising:

disposing within the trench a silicon material having a conductivity type opposite a conductivity type of the semiconductor region such that the silicon material and the semiconductor region collectively form at least a portion of a p-n pillar.

24. The method of claim 16, wherein the semiconductor region includes an epitaxial layer extending over a substrate, and the trench is formed in the epitaxial layer, the method further comprising:

disposing within the trench a silicon material having a conductivity type opposite a conductivity type of the epitaxial layer such that the silicon material and the epitaxial layer form at least a portion of a p-n pillar.

25. The method of claim 1, wherein the second slope is substantially constant from a top of the trench to a bottom of the trench.

26. The method of claim 1, wherein the bevel etch removes a layer of the semiconductor region in the mesa region.

27. A method for forming a semiconductor structure, comprising:

forming a single masking layer on a semiconductor region;

forming a trench in the semiconductor region using an opening in the single masking layer, the trench having a sidewall having a substantially constant first slope along a depth of the trench and defining a mesa region adjacent to the trench;

removing completely the single masking layer; and tapering the sidewall of the trench so that the sidewall has a substantially constant second slope along the depth of the trench, the second slope being less than the first slope.

28. The method of claim 27, further comprising, in conjunction with the tapering the sidewall, removing a layer of the semiconductor region in the mesa region.

29. The method of claim 27, wherein the trench is a first trench and the opening is a first opening, the method further comprising:

forming a second trench in the semiconductor region using a second opening in the single masking layer, the mesa region being disposed between the first trench and the second trench.

30. The method of claim 27, wherein:

the tapering the sidewall does not widen a width along a bottom of the trench; and the tapering the sidewall does not extend a depth of the trench.

* * * * *